(12) United States Patent
Ishida et al.

(10) Patent No.: US 6,939,665 B2
(45) Date of Patent: Sep. 6, 2005

(54) SYSTEM AND METHODS FOR MANUFACTURING A MOLECULAR FILM PATTERN

(75) Inventors: Masaya Ishida, Hara-mura (JP); Takashi Miyazawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 140 days.

(21) Appl. No.: 10/026,653

(22) Filed: Dec. 27, 2001

(65) Prior Publication Data

US 2002/0182890 A1 Dec. 5, 2002

(30) Foreign Application Priority Data

Dec. 28, 2000 (JP) ........................................ 2000-403230

(51) Int. Cl.$^7$ ................................................ G03C 5/56
(52) U.S. Cl. ..................... 430/311; 430/320; 430/270.1
(58) Field of Search ............................ 430/270.16, 313, 430/322, 311, 320, 270.1

(56) References Cited

U.S. PATENT DOCUMENTS 5,079,600 A    1/1992  Schnur et al. .................. 357/4

OTHER PUBLICATIONS

Dressick, Walter J. et al., "Patterning of Self–Assembled Films Using Lithographic Exposure Tools", *Jpn. J. Appl. Phys.*, vol. 32 (1993), pp. 5829–5839.

*Primary Examiner*—John A. McPherson
*Assistant Examiner*—Daborah Chacko-Davis
(74) *Attorney, Agent, or Firm*—Oliff & Berridge, PLC

(57) ABSTRACT

The invention provides an organic silane molecular film, having a thickness of 3 nm or less and an aromatic hydrocarbon group as a part of the molecular structure of the film that is formed on the surface of the substrate. Accordingly, a molecular film pattern can be efficiently formed by using a molecular film having a superior photolytic property. Additionally, the invention can provide a patterning technique that can easily form a molecular film pattern at a high speed with the number of steps of manufacturing a semiconductor device, as well as the cost, being reduced.

20 Claims, 8 Drawing Sheets

SYSTEM AND METHODS FOR MANUFACTURING A MOLECULAR FILM PATTERN

BACKGROUND OF THE INVENTION

1. Field of Invention

The present invention relates to a molecular film and a molecular film pattern, both of which are formed on a surface of a substrate or on an underlying layer, and relates to manufacturing methods therefor. In addition, the present invention also relates to a semiconductor device and to an electro-optical device, both of which use the molecular film, the molecular film pattern, and the manufacturing methods therefor mentioned above, and relates to manufacturing methods for the devices mentioned above.

2. Description of Related Art

Currently, among manufacturing steps of semiconductor devices or electro-optical devices, a photolithographic method has been used for a step of patterning a thin-film, which is an important step. A photolithographic method is capable of forming a highly fine pattern of the submicron order. In general, patterning using a photolithographic method can be performed by the steps described below. First, a thin-film to be patterned is formed over the entire surface of a substrate. In addition, the formation of a resist film, exposure, development, rinsing, and the like are performed, thereby forming a resist pattern. Subsequently, by using the resist pattern as an etching resistant mask, the thin-film disposed thereunder is etched so that unnecessary parts are removed, thereby forming a desired pattern.

SUMMARY OF THE INVENTION

When patterning is performed by using a photolithographic method as described above, a number of steps must be performed. On the other hand, in recent years, attempts in which patterning is performed using a molecular film having a thickness smaller than that of a resist film have been made in order to decrease the number of steps. However, a molecular film having a more superior photolytic property has been desired.

Accordingly, a first object of the present invention is to efficiently form a molecular film pattern by using a molecular film having a superior photolytic property. A second object is to obtain a semiconductor device and an electro-optical device by using the molecular film, the molecular film pattern, and the manufacturing methods therefor described above. Another object is to provide methods for manufacturing the semiconductor device and the electro-optical device described above.

A first method for manufacturing a molecular film pattern according to the present invention can include a step of forming a molecular film by using a photolytic organic silicon compound, which contains an aromatic hydrocarbon group, as a starting material; and a step of irradiating the molecular film with a light. According to this method, since the molecular film described above is formed of the organic silicon compound containing an aromatic hydrocarbon group which has high photoabsorption efficiency, a desired molecular film pattern can be easily formed by performing light irradiation on the molecular film in accordance with a predetermined pattern shape. In this specification, the molecular film means a film having thickness of 100 nm or less. Ideally, the thickness is preferably 5 nm or less. However, a molecular film formed of a material having polymeric chains may have a thickness of 100 nm or more in some cases.

A second method for manufacturing a molecular film pattern according to the present invention can include a step of forming a molecular film by using an organic silicon compound as a starting material, the organic silicon compound having a chemical structure represented by the following formula (1); and a step of irradiating the molecular film with a light. According to this method, since the molecular film described above is formed of the organic silicon compound containing an aromatic hydrocarbon group which has high photoabsorption efficiency, a desired molecular film pattern can be easily obtained by performing light irradiation on the molecular film in accordance with a predetermined pattern shape. As the aryl (Ar) group in the formula (1), for example, there may be mentioned a phenyl group, a biphenyl group, a naphthyl group, an anthryl group, or a phenanthryl group. It may also be bonded to a major chain of a polymer via $(CR_2)_m$—Z which is a substituent bonded to the aromatic hydrocarbon group.

(1)

In the above formula, n, m, p, Ar, X, Y, and R are as follows:
- n is an integer of 0 or more;
- m is an integer of 0 or more;
- p is an integer of 0 or more;
- Ar is an aryl group;
- R is a hydrogen atom or a fluorine atom;
- X is a halogen group such as a chlorine group, an amino group, or an alkoxyl group;
- Y is an alkyl group, an aryl group, or a hydrogen atom; and
- Z is an alkyl group, a perfluoroalkyl group, a silyl group, a cyano group, an amine group, or a thiol group.

A third method for manufacturing a molecular film pattern according to the present invention can include a step of forming a molecular film by using an organic silicon compound as a starting material, the organic silicon compound having a chemical structure represented by the following formula (2); and a step of irradiating the molecular film with a light. According to this method, since the molecular film described above is formed of the organic silicon compound having a π electron system of the benzene structure which has high photoabsorption efficiency, a desired molecular film pattern can be easily obtained by performing light irradiation.

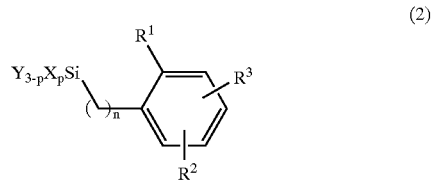
(2)

In the above formula, n, p, $R^1$, $R^2$, $R^3$, X, and Y are as follows:
- n is an integer of 0 or more;
- p is an integer of 0 or more;
- $R^1$ is a hydrogen atom, a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, or an alkyl group containing an alkylamino group;

$R^2$ is a hydrogen atom, a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, an alkyl group containing an alkylamino group, an organic silicon group, or an alkyl group containing an organic silicon group;

$R^3$ is a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, an alkyl group containing an alkylamino group, an organic silicon group, an alkyl group containing an organic silicon group, an aryl group, or an alkyl group containing an aryl group;

X is a halogen group such as a chlorine group, an amino group, or an alkoxyl group; and Y is an alkyl group or an aryl group.

A fourth method for manufacturing a molecular film pattern according to the present invention can include a step of forming a molecular film by using an organic silicon compound as a starting material, the organic silicon compound having a chemical structure represented by the following formula (3); and a step of irradiating the molecular film with a light. According to this method, since the molecular film described above is formed of the organic silicon compound having a π electron system of the naphthalene structure which has high photoabsorption efficiency, a desired molecular film pattern can be easily obtained by performing light irradiation.

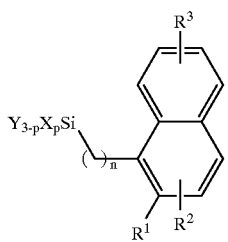

(3)

In the above formula, n, p, $R^1$, $R^2$, $R^3$, X, and Y are as follows:

n is an integer of 0 or more;

p is an integer of 0 or more;

$R^1$ is a hydrogen atom, a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, or an alkyl group containing an alkylamino group;

$R^2$ is a hydrogen atom, a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, an alkyl group containing an alkylamino group, an organic silicon group, or an alkyl group containing an organic silicon group;

$R^3$ is a hydrogen atom, a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, an alkyl group containing an alkylamino group, an organic silicon group, or an alkyl group containing an organic silicon group, X is a halogen group such as a chlorine group, an amino group, or an alkoxyl group; and Y is an alkyl group or an aryl group.

A fifth method for manufacturing molecular film pattern according to the present invention can include a step of forming a molecular film by using an organic silicon compound as a starting material, the organic silicon compound having a chemical structure represented by the following formula (4); and a step of irradiating the molecular film with a light. According to this method, since the molecular film described above is formed of the organic silicon compound having a π electron system of the naphthalene structure which has high photoabsorption efficiency, a desired molecular film pattern can be easily obtained by performing light irradiation.

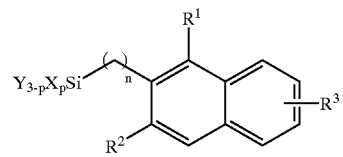

(4)

In the above formula, n, p, $R^1$, $R^2$, $R^3$, X, and Y are as follows:

n is an integer of 0 or more;

p is an integer of 0 or more;

$R^1$ is a hydrogen atom, a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, or an alkyl group containing an alkylamino group;

$R^2$ is a hydrogen atom, a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, an alkyl group containing an alkylamino group, an organic silicon group, or an alkyl group containing an organic silicon group;

$R^3$ is a hydrogen atom, a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, an alkyl group containing an alkylamino group, an organic silicon group, or an alkyl group containing an organic silicon group;

X is a halogen group such as a chlorine group, an amino group, or an alkoxyl group; and Y is an alkyl group or an aryl group.

A sixth method for manufacturing a molecular film pattern according to the present invention can include a step of forming a molecular film by using an organic silicon compound as a starting material, the organic silicon compound having a chemical structure represented by the following formula (5); and a step of irradiating the molecular film with a light. According to this method, since the molecular film described above is formed of the organic silicon compound having a π electron system of the biphenyl structure which has high photoabsorption efficiency, a desired molecular film pattern can be easily obtained by performing light irradiation.

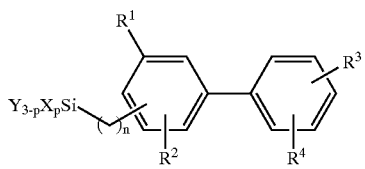

(5)

In the above formula, n, p, $R^1$, $R^2$, $R^3$, $R^4$, X, and Y are as follows:

n is an integer of 0 or more;

p is an integer of 0 or more;

$R^1$ is a hydrogen atom, a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, or an alkyl group containing an alkylamino group;

$R^2$ is a hydrogen atom, a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, an alkyl group containing an alkylamino group, an organic silicon group, or an alkyl group containing an organic silicon group;

$R^3$ is a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, an alkyl group containing an alkylamino group, an organic silicon group, or an alkyl group containing an organic silicon group;

$R^4$ is a hydrogen atom, a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, an alkyl group containing an alkylamino group, an organic silicon group, or an alkyl group containing an organic silicon group;

X is a halogen group such as a chlorine group, an amino group, or an alkoxyl group; and Y is an alkyl group or an aryl group.

A seventh method for manufacturing a molecular film pattern according to the present invention can include a step of forming a molecular film by using an organic silicon compound as a starting material, the organic silicon compound having a chemical structure represented by the following formula (6); and a step of irradiating the molecular film with a light. According to this method, since the molecular film described above is formed of the organic silicon compound having a π electron system of the pyridine structure which has high photoabsorption efficiency, a desired molecular film pattern can be easily obtained by performing light irradiation. In addition, due to high affinity of the nitrogen atom of the pyridine ring to various positive elements such as metal elements, a complex with the element mentioned above may be easily formed, and by performing appropriate chemical treatment, additional functions may be further provided for the molecular film pattern.

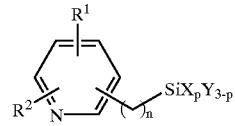

(6)

In the above formula, n, p, $R^1$, $R^2$, X, and Y are as follows:

n is an integer of 0 or more;

p is an integer of 0 or more;

$R^1$ is a hydrogen atom, a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, or an alkyl group containing an alkylamino group;

$R^2$ is a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, an alkyl group containing an alkylamino group, an organic silicon group, an alkyl group containing an organic silicon group, an aryl group, or an alkyl group containing an aryl group, X is a halogen group such as a chlorine group, an amino group, or an alkoxyl group; and Y is an alkyl group or an aryl group.

A eighth method for manufacturing a molecular film pattern according to the present invention can include a step of forming a molecular film by using an organic silicon compound as a starting material, the organic silicon compound having a chemical structure represented by the following formula (7); and a step of irradiating the molecular film with a light. According to this method, since the molecular film described above is formed of the organic silicon compound containing a conjugated electron system heterocyclic group, such as thiophene, pyrrole, or furan, which has high photoabsorption efficiency, a desired molecular film pattern can be easily obtained by performing light irradiation. In addition, since the organic silicon compound described above has a heteroatom having reactive functionality, such as a sulfur atom, a nitrogen atom, or an oxygen atom, which forms the heterocyclic ring, by performing appropriate chemical treatment, additional functions may be further provided for the molecular film pattern.

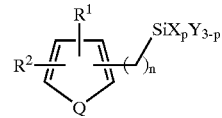

(7)

In the above formula, n, p, $R^1$, $R^2$, X, Y, and Q are as follows;

n is an integer of 0 or more;

p is an integer of 0 or more;

$R^1$ is a hydrogen atom, a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, or an alkyl group containing an alkylamino group;

$R^2$ is a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, an alkyl group containing an alkylamino group, an organic silicon group, an alkyl group containing an organic silicon group, an aryl group, or an alkyl group containing an aryl group;

X is a halogen group such as a chlorine group, an amino group, or an alkoxyl group;

Y is an alkyl group or an aryl group; and

Q is a nitrogen (N) atom, an oxygen (O) atom, or a sulfur (S) atom, each having a hydrogen atom or an alkyl group.

A ninth method for manufacturing a molecular film pattern according to the present invention can include a step of forming a molecular film by using an organic silicon compound as a starting material, the organic silicon compound having a chemical structure represented by the following formula (8); and a step of irradiating the molecular film with a light. According to this method, since the molecular film described above is formed of the organic silicon compound having a benzene ring provided with a fluoroalkyl group which has a superior liquid-repellent property, this molecular film has superior photoreactivity and a high liquid-repellent property. Accordingly, by performing light irradiation on this molecular film, a molecular film pattern having a different liquid-repellent property can be formed. In addition, in order to obtain a superior liquid-repellent property, the number of atoms of a carbon chain of a fluoroalkyl group is preferably three or more.

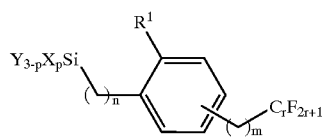

(8)

In the above formula, n, m, r, p, $R^1$, X, and Y are as follows:

n is an integer of 0 or more;

m is an integer of 0 or more;

r is a positive integer;

p is an integer of 0 or more;

$R^1$ is a hydrogen atom, a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, or an alkyl group containing an alkylamino group;

X is a halogen group such as a chlorine group, an amino group, or an alkoxyl group; and Y is an alkyl group or an aryl group.

A tenth method for manufacturing a molecular film pattern according to the present invention can include a step of forming a molecular film by using an organic silicon compound as a starting material, the organic silicon compound having a chemical structure represented by the following formula (9); and a step of irradiating the molecular film with a light. According to this method, since the molecular film described above is formed of the organic silicon compound, which has a fluoroalkyl group provided with a superior liquid-repellent property in addition to a π electron system of the biphenyl structure provided with high photoabsorption efficiency, when light irradiation is performed on this molecular film, a molecular film pattern having a different liquid-repellent property can be formed. In addition, in order to obtain a superior liquid-repellent property, the number of atoms of a carbon chain of a fluoroalkyl group is preferably three or more.

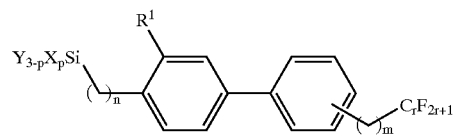

(9)

In the above formula, n, m, r, p, $R^1$, X, and Y are as follows:

n is an integer of 0 or more;

m is an integer of 0 or more;

r is a positive integer;

p is an integer of 0 or more;

$R^1$ is a hydrogen atom, a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, or an alkyl group containing an alkylamino group;

X is a halogen group such as a chlorine group, an amino group, or an alkoxyl group; and Y is an alkyl group or an aryl group.

A eleventh method for manufacturing a molecular film pattern according to the present invention can include a step of forming a molecular film by using an organic silicon compound as a starting material, the organic silicon compound having a chemical structure represented by the following formula (10); and a step of irradiating the molecular film with a light. According to this method, since the molecular film described above is formed of the organic silicon compound, which has a fluoroalkyl group provided with a superior liquid-repellent property in addition to a π electron system of the biphenyl structure provided with high photoabsorption efficiency, when light irradiation is performed on this molecular film, a molecular film pattern having a different liquid-repellent property can easily be formed. In addition, in order to obtain a superior liquid-repellent property, the number of atoms of a carbon chain of a fluoroalkyl group is preferably three or more.

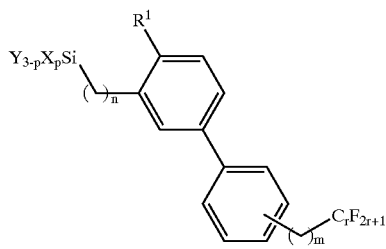

(10)

In the above formula, n, m, r, p, $R^1$, X, and Y are as follows:

n is an integer of 0 or more;

m is an integer of 0 or more;

r is a positive integer;

p is an integer of 0 or more;

$R^1$ is a hydrogen atom, a halogen atom, a perfluoroalkyl group, a hydroxyl group, a thiol group, an amino group, an alkylamino group, an alkoxyl group, an alkyl group containing a hydroxyl group, an alkyl group containing a thiol group, an alkyl group containing an amino group, or an alkyl group containing an alkylamino group;

X is a halogen group such as a chlorine group, an amino group, or an alkoxyl group; and Y is an alkyl group or an aryl group.

In a twelfth method for manufacturing a molecular film pattern according to the present invention, $R^1$ of the organic silicon compound according to one of the methods for manufacturing the third to sixth and the ninth to eleventh molecular film patterns of the present invention is a perfluoroalkyl group. According to this method, the molecular film described above is formed of the organic silicon compound containing the perfluoroalkyl group at the ortho-position with respect to the organic silicon group. In this type of organic silicon compound, since a silicon atom and a fluorine atom having a high affinity thereto are spatially adjacent to each other, the attack of the fluorine atom to the silicon atom easily occurs, and hence, the photoreactivity or the photolytic property can be improved. Accordingly, a molecular film pattern can be obtained by light irradiation for a short period of time.

In a thirteenth method for manufacturing a molecular film pattern according to the present invention, $R^1$ of the organic silicon compound according to one of the methods for manufacturing the third to sixth and the ninth to eleventh molecular film patterns of the present invention is a trifluoromethyl group. According to this method, the molecular film described above is formed of the organic silicon compound containing a trifluoromethyl group disposed at the ortho-position with respect to the organic silicon group. In this type of organic silicon compound, since a silicon atom and a fluorine atom having a high affinity thereto are spatially adjacent to each other, when photolytic reaction occurs, the photoreactivity or the photolytic property can be improved by the assistance of the fluorine atom. Accordingly, the molecular film pattern can be obtained by light irradiation within a short period of time. In this method, as the organic silicon compound for forming this molecular film, a compound represented by the formula (11) or (12) is mentioned.

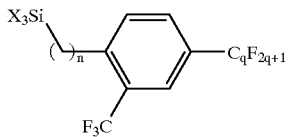

(11)

In the above formula, n and q are as follows:

n is an integer of 0 or more; and q is an integer of 1 or more.

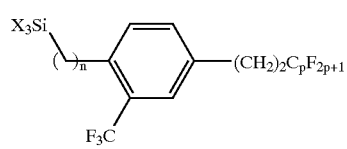

(12)

In the above formula, n and p are as follows:

n is an integer of 0 or more; and p is an integer of 1 or more.

In a fourteenth method for manufacturing a molecular film pattern according to the present invention, the thickness of the molecular film according to the method for manufacturing the molecular film pattern of the present invention is 3 nm or less. This molecular film has a thickness enough to modify the properties of the surfaces of the substrate or the underlying layer, and when the molecular film pattern is formed, high contrast of the surface functions or surface properties can be obtained.

A molecular film pattern of the present invention may be formed by one of the methods for manufacturing the molecular film patterns described above. Since the molecular film pattern described above is a molecular film pattern formed by patterning a molecular film having various functions such as a liquid-repellent property, surfaces with different functions are exposed in this molecular film pattern.

A method for manufacturing a semiconductor device of the present invention comprises a step of forming a molecular film pattern according to the manufacturing method for the molecular film pattern described above. In the method for manufacturing the semiconductor device described above, since the method for manufacturing the molecular film pattern may be used instead of, for example, a photolithographic method, the number of steps can be decreased. This type of method for manufacturing the semiconductor device can be effectively applied to a semiconductor device such as a transistor which is formed by a process including a step of forming a pattern. For example, in addition to a silicon-based transistor and a thin-film transistor, an organic thin-film transistor having a semiconductor layer formed of an organic material may be mentioned.

A first semiconductor device of the present invention can be manufactured by the method for manufacturing the semiconductor device described above. One of the features of this type of semiconductor device is that, since it is formed by using a molecular film having a small thickness, market demands to make thinner and more compact semiconductor devices can be satisfied.

A method for manufacturing an electro-optical device of the present invention can include a step of forming a molecular film pattern according to the method for manufacturing the molecular film pattern described above. In the method for manufacturing the electro-optical device described above, since the method for manufacturing the molecular film pattern described above can be used instead of, for example, a photolithographic method, the number of steps can be decreased. Accordingly, this type of method for manufacturing the electro-optical device has advantages in that the production time or the production cost can be reduced.

A first electro-optical device of the present invention is manufactured by the method for manufacturing the electro-optical device described above.

A second semiconductor device of the present invention is formed by the manufacturing method described above and can include an area composed of an organic material. As an example of a semiconductor device using an organic material, a so-called organic thin-film transistor may be mentioned. In the manufacturing process therefor, a liquid-phase process, such as a spin coating method or an inkjet method, which does not usually require a complicated apparatus, may also be used, and hence, advantage in production cost can also be obtained.

A second electro-optical device of the present invention is formed by the manufacturing method described above and can include an organic electroluminescent element.

A method for manufacturing an electronic device of the present invention can include a step performed by using the method for manufacturing the molecular film patterns described above. As the electronic device, a diode may be mentioned by way of example.

An electronic apparatus of the present invention can include the electro-optical device described above as a display portion.

BRIEF DESCRIPTION OF THE DRAWINGS

The invention is described with reference to the following figures, wherein like numerals represent like elements, and wherein.

DETAILED DESCRIPTION OF PREFERRED EMBODIMENTS

Hereinafter, preferred embodiments of the present invention will be described.

(1) Brief Explanation for Manufacturing Steps of Molecular Film and Molecular Film Pattern Manufacturing steps of a molecular film and a molecular film pattern will be described briefly with reference to FIGS. 1 to 5.

Figure 1:
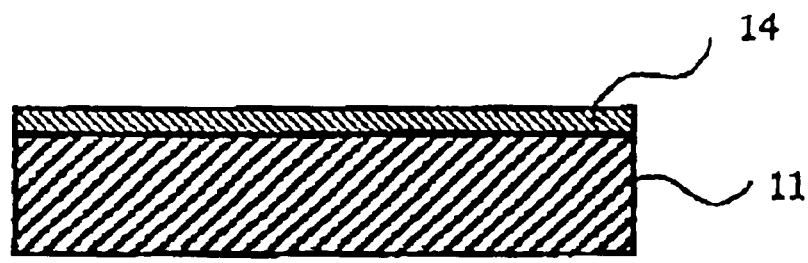
FIG. 1 is a cross-sectional view showing the state in which a molecular film is formed on a substrate.

First, as shown in FIG. 1, a molecular film 14 is formed on a surface of a substrate 11 by using an organic silicon compound containing an aromatic hydrocarbon group as a starting material. The molecular film 14 can be obtained by placing the organic silicon compound used as a starting material and the substrate in a closed container or by immersing the substrate in a solution containing the organic silicon compound used as a starting material followed by removal of the solvent.

Figure 2:
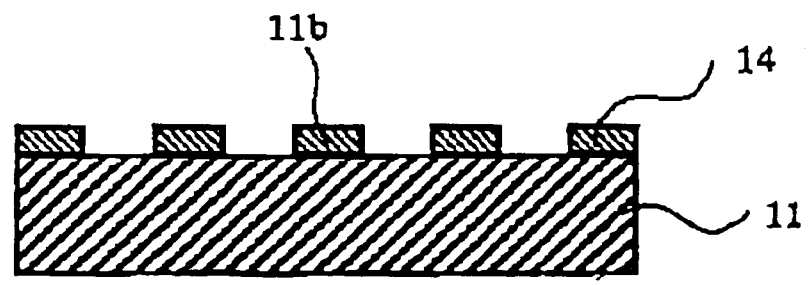
FIG. 2 is a cross-sectional view showing the state in which the molecular film is patterned.
Figure 3:
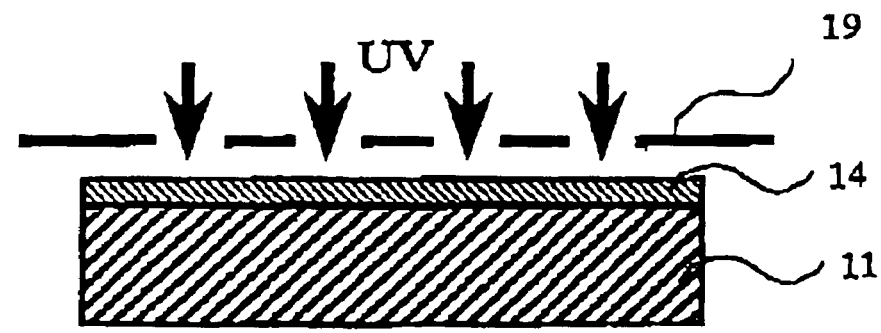
FIG. 3 is a cross-sectional view showing a step of patterning the molecular film.

Next, as shown in FIG. 2, patterning of the molecular film 14 is performed. As a patterning method for a molecular film according to the present invention, for example, a light irradiation method can be performed. As shown in FIG. 3, a light irradiation method is performed by irradiating the molecular film 14 with a light via openings formed in a photomask 19 provided for forming a thin-film pattern. Parts of the molecular film 14 which are irradiated by light are decomposed or removed, and hence, a molecular film pattern in accordance with the photomask 19 is formed.

Figure 4:
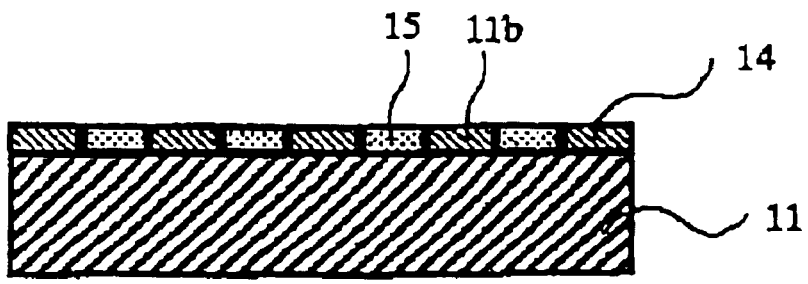
FIG. 4 is a cross-sectional view showing the state in which a second molecular film is formed in an area at which a first molecular film is removed.
Figure 5:
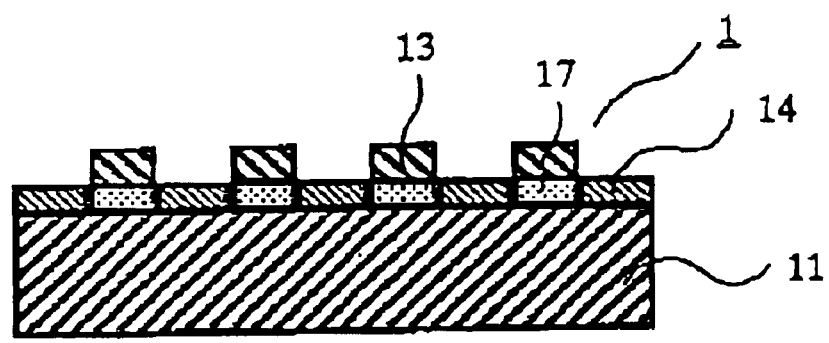
FIG. 5 is a cross-sectional view showing the state in which an electroless plating film is formed on the area which is covered with the second molecular film.
Figure 6:
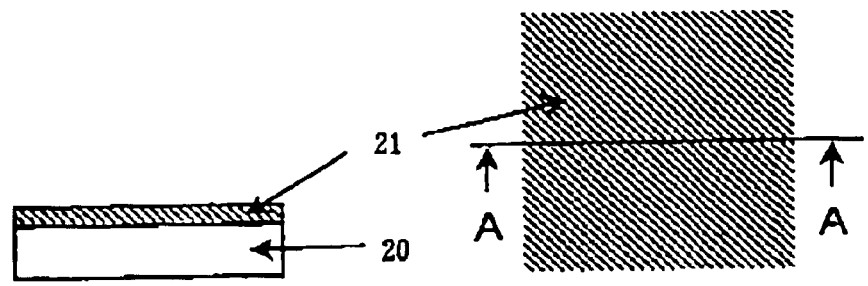
FIG. 6 is a viewing showing a first step of manufacturing an organic electroluminescent device driven by an organic thin-film transistor.

Furthermore, as shown in FIG. 4, only on the areas at which the parts of the molecular film 14 are removed, areas 15 composed of a molecular film may also be formed in which the molecular film mentioned above is formed by using an organic silicon compound as a starting material having a functional group provided with a property or a function different from that of the organic silicon compound for forming the molecular film 14. Accordingly, areas having surface properties different from those of the molecular film 14 can be formed on the surface of the substrate. When a functional group of the organic silicon compound forming the molecular film 15 is properly selected, for example, an electroless plating film 17 may be formed only on areas corresponding to the molecular film 15 as shown in FIG. 5.

(2) Example 1

Hereinafter, examples of steps of forming a molecular film and a molecular film pattern will be described in particular.

According to this example, as pretreatment, cleaning was performed by irradiating a quartz glass substrate with UV light having a wavelength of 172 nm for 10 minutes. The intensity of the UV light which was used was approximately 8 mW/cm$^2$ at the surface of the substrate.

Next, (Heptadecafluorooctylbenzyl)triethoxysilane, having a superior liquid-repellent property and being one of organic silicon compounds having the chemical structure represented by the formula (8), and a quartz glass substrate were kept in the same closed container at room temperature for 96 hours, thereby forming a first molecular film. Subsequently, in addition, the first molecular film is irradiated for approximately 15 minutes with ultra violet light (a light intensity at the quartz glass substrate was approximately 5 mW/cm$^2$) having a wavelength of 308 nm using an excimer lamp via a photomask having a stripe pattern so that parts of the molecular film which are not covered with the mask are selectively photolyzed, thereby forming a first molecular film pattern.

When the contact angle at an area at which a molecular film was irradiated was observed for evaluating decomposition rate of a molecular film by irradiation, it was found that the decomposition rate of the first molecular film formed by using (heptadecafluorooctylbenzyl) triethoxysilane as a starting material was three times or more that of a molecular film formed by using (heptadecafluorotetrahydrodecyl)triethoxysilane as a starting material. According to this result, it was found that a molecular film formed by using an organic silicon compound containing an aromatic group, such as benzene, as a starting material exhibited an improved photolytic efficiency.

Next, the substrate provided with the first molecular film pattern was washed using pure water and ethanol in that order and was then immersed in a mixed solution of ethanol containing 1 vol % of aminobenzyltriethoxysilane for 5 minutes. In addition, when the substrate was washed using ethanol and pure water in that order, a second molecular film pattern formed by using aminobenzyltriethoxysilane as a starting material was formed at areas at which the first molecular film was removed.

Next, the substrate provided with the first molecular film pattern and the second molecular film pattern was immersed for approximately 2 minutes in an aqueous solution containing palladium chloride so as to have a pH of 5.8 at room temperature (30 ml of an aqueous solution containing 4% of hydrogen chloride and 0.2% of a palladium salt was further dissolved in 1 liter of water for dilution) and was then washed using running water for 3 minutes. Next, an electroless nickel plating solution (having a composition containing 30 g/L of a nickel salt and a nickel salt of hypophosphorous acid and 10 g/L of sodium hypophosphite) having a pH of 4.6 was maintained at 70° C., and this substrate was then immersed in the solution described above for approximately 1 minute. Subsequently, the substrate was recovered from the solution, was washed by running water, and was then dried. After drying, when observation was performed by using an optical microscope, it was confirmed that a nickel pattern was formed on areas corresponding to the areas of the second molecular film pattern on the substrate.

In the present invention, it should be understood that in addition to a quartz glass substrate, as a substrate on which a molecular film is formed, various substrates, such as a Si wafer, glass, a plastic film, or a metal substrate, may be used, and on the surface of the substrate, a metal film, a dielectric film, an organic film, or the like may be formed as an underlying layer.

As a light source for irradiation used for forming a pattern of a molecular film, in addition to the excimer lamp described above, for example, a mercury lamp, a xenon lamp, a sodium lamp, an excimer laser, an Nd:YAG laser, or its higher harmonic wave may also be used.

As in the example described above, when a molecular film pattern having a liquid-repellent property is formed, an organic silicon compound having a long-chain fluoroalkyl group, such as (heptadecafluorooctylbenzyl)triethoxysilane which has a liquid-repellent property, is preferably used as a starting material, however, the compound having a general long-chain alkyl group may also be used. A substituent bonded to a silicon atom is not limited to an ethoxy group, such as (heptadecafluorooctylbenzyl)triethoxysilane, and it should be understood that an alkoxyl group such as a methoxy group, a halogen group such as a chlorine, a bromine, or an iodine atom, or an amino group may also be used. In particular, the case in which the surface of a substrate or an underlying layer on which a molecular film is formed is covered with substituents having chalcogen atoms, such as hydroxyl groups, may be preferable in some cases. The reason for this is that when an organic silicon compound having the substituent bonded to the silicon atom described above forms a molecular film, the molecular film may form stable bond with the substrate or the underlying layer.

In the example described above, in order to selectively form an electroless plating film composed of nickel, an organic silicon compound having an amino group which has a high affinity to nickel was used as a starting material for forming the second molecular film, however, in addition to this compound described above, when a molecular film formed by using an organic silicon compound containing a thiol group, a hydroxyl group, a vinyl group, a hydrosilyl group, a cyano group, or the like is used as a starting material, various metal thin-films, such as gold or copper, may also be formed. Naturally, it is not always necessary to initially form a molecular film pattern having a liquid-repellent property as in the example described above, and a proper molecular film can be selectively formed in accordance with an object. When light-irradiation is used for the formation of a molecular film pattern, a molecular film formed by using an organic silicon compound as a starting material which contains an aromatic group having a chemical structure represented by one of the formulas (1) to (12) is preferably used. In addition, when an aromatic group of an organic silicon compound is selected in accordance with a wavelength used for light irradiation, a molecular film pattern can be more efficiently formed.

In the case in which light having a wavelength of approximately 300 nm is used for forming a molecular film pattern, an organic silicon compound containing an aromatic group, such as benzene, naphthalene, or biphenyl, is preferable as a starting material. In the case in which light having a wavelength of 300 nm or more, an organic silicon compound containing an aromatic group, such as anthracene, phenanthrene, or terphenyl, is preferable as a starting material.

The efficiency of photolysis does not only depend on an aromatic group of an organic silicon compound, but also may be affected by a substituent bonded to the aromatic group in some cases. For example, in an organic silicon compound having a trifluoromethyl group at the ortho-position of an alkyl group containing an organic silicon group, such as an organic silicon compound having a chemical structure represented by the above formula (11) or (12), since the fluorine atoms each having high affinity to the silicon atom are spatially adjacent thereto, activation energy required for breaking the bond between the silicon atom and the carbon atom decreases, and hence, a photolytic reaction occurs efficiently. In addition to a trifluoromethyl group, a substituent containing an atom having high affinity to a silicon atom, such as a hydroxy group, an alkoxyl group, or an amino group, may promote photolysis in some cases.

(3) Synthesis of Organic Silicon Compound used as Starting Material for Molecular Film Next, an exemplary method for synthesizing an organic silicon compound used as a starting material for forming a molecular film will be described. As typical synthetic methods for organic silicon compounds having the structures represented by the above formulas (1) to (12), the following two methods (i) and (ii) are mentioned.

(i) A reaction shown by the following general formula (13). This reaction occurs between an organic silicon compound containing a halogen atom or an alkoxyl group and a Grignard reagent obtained from a compound having a halogen atom, such as a bromine atom, a chlorine atom, or an iodine atom, or a lithium reagent.

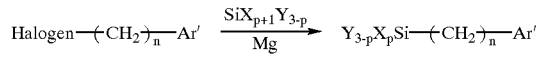
(13)

In the above formula, n, p, and Ar' are as follows:

n is an integer of 0 or more;

p is an integer of 0 or more; and

Ar' is an aromatic hydrocarbon group or a derivative thereof.

(ii) A hydrosilation reaction shown by the following general formula (14). This reaction occurs between a compound having a double bond or more between carbons and an organic silicon compound having at least one hydrogen atom bonded to the silicon atom by heating and stirring in the presence of a catalyst such as chloroplatinic acid.

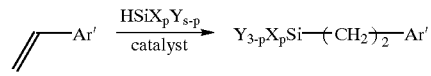
(14)

In the above formula, n, p, and Ar' are as follows:

n is an integer of 0 or more;

p is an integer of 0 or more; and

Ar' is an aromatic hydrocarbon group or a derivative thereof.

In the present invention, synthesis performed in accordance with the method (i) will be described by way of example.

(4) Synthesis of p-($CF_3CF_2CF_2CF_2CF_2CF_2CH_2CH_2$—$C_6H_4$—$CH_2$—$Si(OEt)_3$) (Compound A)

A magnesium ribbon is placed in a flask, and white an inert gas, such as argon or nitrogen, is allowed to flow therein, the ribbon is appropriately heated and also stirred by a hot plate which is also used as a stirrer, so that the magnesium ribbon (0.06 mol) is activated. After the operation described above is performed for approximately 1 hour, the flask is cooled to room temperature, and approximately 5 ml of ether is then added. In addition, by adding an extremely small amount of dibromoethane by using a syringe, an activated surface of the magnesium ribbon is exposed. Next, 20 ml of an ether solution containing 0.05 mol of p-($CF_3CF_2CF_2CF_2CF_2CF_2CH_2CH_2$—$C_6H_4$—$CH_2$—Br) and 0.07 mol of tetraethoxysilane is received in a dripping funnel provided for the flask, and while being well stirred, this ether solution is then slowly dripped in the mixture of the magnesium ribbon and the ether. In the step described above, the temperature of the reaction solution is controlled by using an ice bath or the like so as not to reach a temperature of approximately 40° C. or more. After dripping, the mixture thus obtained is stirred for approximately 15 hours at room temperature, the ether used as the solvent is removed by distillation, a small amount of hexane is added, and a salt precipitated is filtered by using a Hyflo super-cel. In the step described above, filtration is preferably repeated until the haze of the filtrate disappears. Next, the solvent in the filtration is removed by using a rotary evaporator, and when reduced pressure distillation of a remaining oily material using a Kugelrohl method is performed, a compound A is obtained at a rough yield of approximately 40%.

(5) Synthesis of p-($HMe_2Si$—$CH_2$—$CH_6H_4$—$CH_2$—$Si(OEt)_3$) (Compound B)

A magnesium ribbon is placed in a flask, and while an inert gas, such as argon or nitrogen, is allowed to flow therein, the ribbon is appropriately heated and also stirred by a hot plate which is also used as stirrer, so that the magnesium ribbon (0.06 mol) is activated. After the operation described above is performed for approximately 1 hour, the flask is cooled to room temperature, and 5 ml of ether and 0.05 mol of dimethylchlorosilane (chemical formula: $HMe_2SiCl$) are then added. Next, 0.05 mol of dimethylchlorosilane ($HMe_2SiCl$) is added. Subsequently, 20 ml of an ether solution containing p-(Br—$CH_2$—$C_6H_4$—$CH_2$—Br) is received in a dripping funnel provided for the flask, and while being well stirred, this ether solution is then slowly dripped in the mixture of dimethylchlorosilane, the magnesium ribbon and the ether. In the step described above, in order to avoid violent reaction, the reaction temperature is controlled by using an ice bath or the like so that the reaction proceeds appropriately. After the ether solution is dripped, the mixture thus obtained is stirred for approximately 15 hours at room temperature, a saturated aqueous solution containing ammonium chloride is slowly added, so that the magnesium salt thus formed is hydrolyzed. Appropriate amounts of ether and water are added, and sodium sulfate is added to an ether layer obtained by a separation process, so that the ether layer is dried. Next, volatile impurities, such as the ether used as the solvent, are removed by using a rotary evaporator, and when reduced-pressure distillation of a remaining oily material using a Kugelrohl method is performed p-($HMe_2Si$—$CH_2$—$C_6H_4$—$CH_2$—Br) is obtained at a rough yield of 80%.

The synthetic route described below is almost equivalent to that for the compound A. That is, a magnesium ribbon is placed in a flask, and while an inert gas such as argon or nitrogen is allowed to flow therein, the ribbon is appropriately heated and also stirred by a hot plate which is also used as a stirrer, so that the magnesium ribbon (0.03 mol) is activated. After the operation described above is performed for approximately 1 hour, the flask is cooled to room temperature, and approximately 5 ml of ether is then added. Next, 20 ml of an ether solution containing 0.03 mol of p-($HMe_2Si$—$CH_2$—$C_6H_4$—$CH_2$—Br) and 0.05 mol of tetraethoxysilane is received in a dripping funnel provided for the flask, and while being well stirred, this ether solution is then slowly dripped in the mixture of the magnesium ribbon and the ether. In the step described above, in order to avoid violent reaction, the reaction temperature is controlled by using an ice bath or the like so that the reaction proceeds appropriately.

After the ether solution is dripped, the mixture thus obtained is stirred for approximately 15 hours at room temperature, the ether used as the solvent is removed by distillation, a small amount of hexane is added, and a salt precipitated is filtered by using Hyflo super cell. In the step described above, filtration is preferably repeated until the haze of the filtrate disappears. Next, the solvent in the filtrate is removed by using a rotary evaporator, and when reduced-pressure distillation of a remaining oily material is performed using a Kugelrohl method, a compound B is obtained at a rough yield of approximately 30% with respect to p-($HMe_2Si$—$CH_2$—$C_6H_4$—$CH_2$—Br).

As described above, in particular, a synthetic method using a Grignard reagent is effectively applied to an organic silicon compound having an aromatic group which is provided with a fluoroalkyl group, an alkyl compound group, an organic silicon group, an alkoxyl group, or the like. Even though a yield is naturally decreased a little bit, in a manner as described above, a compound such as shown by the formula 11 or 12, which has a trifluoromethyl group at the ortho-position of the compound A, can also be obtained. In addition, in the case in which an organic silicon compound provided with a substituent, such as a hydroxy group, a thiol group, an amino group, or a cyano group, having highly reactivity with a Grignard reagent is synthesized on an aromatic group, a so-called hydrosilation (the method (ii) described above) performed between corresponding olefin and hydrosilane is effective.

(6) Production of an Electroluminescent Device Driven by Organic Thin-Film Transistor By using the molecular film and the molecular film pattern described above, various semiconductor devices and the electro-optical devices can be further produced. In the examples described below, an organic thin-film transistor having an active layer formed on an organic material and an organic electroluminescent device driven by this organic thin-film transistor will be described as a semiconductor device and an electro-optical device, respectively, with reference to the manufacturing steps thereof. FIGS. 6 to 16 are views showing manufacturing steps of an organic thin-film transistor and an organic electroluminescent device driven by this organic thin-film transistor. Between two drawings in each figure, the drawing on the right side is a plan view, and the drawing on the left side is a cross-sectional view taken along the line AA in the plan view.

First, a transparent conductive film 21 is formed on a substrate 20. As the substrate 20, a transparent material composed of, for example, glass, quartz, or plastic (synthetic resin), is used. In addition, as the transparent conductive film 21, ITO (indium tin oxide) is preferable. However, it should be understood that the transparent conductive film 21 is not limited to an ITO film, and another material may also be used as long as the material is transparent and has high conductivity. In this embodiment, a glass provided with an ITO film is used.

Next, in order to prevent a leak current flowing between a cathode pattern 24 (FIG. 9), which will be described later, and the transparent conductive film 21, an insulating film 22 is formed on the transparent conductive film 21. In this embodiment, $SiO_2$ is used. As a starting material, a liquid material containing polysilazane dissolved in xylene is used, the formation is performed by an inkjet (I/J) method only in an area other than that of a cylinder-shaped opening which is used as a light-emitting area. After the solution containing polysilazane is applied by an I/J method, heating at 250° C. for 10 minutes is performed, thereby selectively forming a $SiO_2$ film having a desired shape and a thickness of 150 nm. In addition, as long as the insulating properties are ensured, it should be understood that the material is not limited to that described above, and an organic polymeric material, such as a polyimide resin, may also be used.

Next, a light-emitting layer 23 may be formed of two layers, that is, a hole injection layer for hole injection and an electroluminescent layer for light emission. Both materials may be formed by using an I/J method. The formation may be performed by using spin coating, deposition, or the like.

Next, the light-emitting layer 23 is formed on the transparent conductive film 21 in an area defined by the insulating film 22. In this embodiment, a cylinder-shaped opening is provided in the insulating film 22 so that the inside periphery thereof is round in plan view, and the light-emitting layer 23 is formed selectively in this opening by an I/J method, in particular, a solution containing a polyolefinic polymer dissolved in xylene used as a solvent is prepared, the solution is applied by an I/J method, and the solvent is dried and removed, thereby forming the light-emitting layer 23. In this embodiment, the thickness of the light-emitting layer 23 is set to approximately 80 nm. In addition, as the light-emitting layer, an organic electroluminescent material such as polyparaphenylene vinylene (PPV) may also be used.

Next, the cathode layer pattern 24 is formed on the insulating film 22 and the light-emitting layer 23 using a metal material. As the metal material, for example, gold, silver, or copper may be used. This cathode layer pattern 24 may be formed by an I/J method or by, for example, a deposition method. In this embodiment, a solution containing a gold complex dissolved in an ethanol solution is used. In particular, as the gold complex, a material represented by $(CH_3)_3$—P—Au—$CH_3$ is used, the concentration thereof is set to approximately 2 wt %, and a solution containing this material is applied by an I/J method and is then heated to 80° C., thereby forming a 50 nm-thick gold film pattern having superior conductivity.

Subsequently, an interlayer insulating film 30 is formed on the cathode layer pattern 24. As the interlayer insulating film 30, for example, polyvinyl alcohol (PVA) or polyimide, which are polymeric materials, may be used. In addition to those, an inorganic material such as $SiO_2$ may also be used. When a polymeric material is used for forming the interlayer insulating film 30, the film formation may be performed by, for example, spin coating or an I/J method. In this embodiment, a PVA solution is applied by a spin coating method, thereby forming a PVA film of 1.5 μm in thickness.

Figure 11:
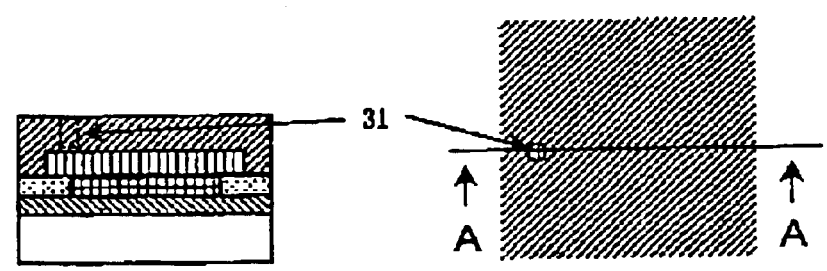
FIG. 11 is a view showing a sixth step of manufacturing the organic electroluminescent device driven by the organic thin-film transistor.

Next, a via hole 31 is formed in the interlayer insulating film 30 for forming an interlayer wire (FIG. 11). A detailed process for forming a via hole is performed basically in accordance with the steps described above with reference to FIGS. 1 to 3. That is, on the interlayer insulating film 30 composed of a polymer material, such as polyvinyl alcohol (PVA) or polyimide, a molecular film is formed by using an organic silicon compound (for example, (heptadecafluorooctylbenzyl)triethoxysilane having a superior liquid-repellent property) having an aromatic hydrocarbon group as a starting material, and irradiation is performed only on an area corresponding to that at which the via hole is to be formed in the molecular film. As a result, a photolytic reaction occurs only in the area described above, and the liquid-repellent property disappears. When this area to which the liquid-repellent, property disappears is treated by a solvent which dissolves the interlayer insulating film, the via hole is formed.

Figure 12:
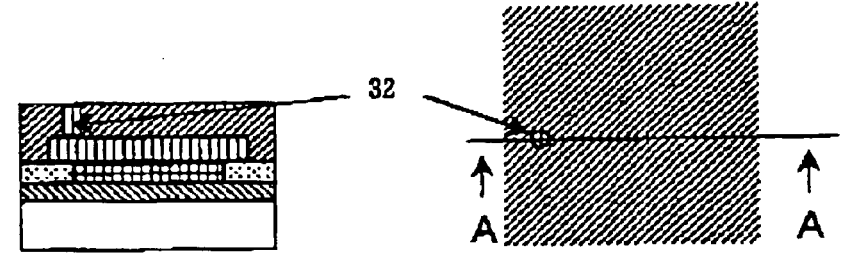
FIG. 12 is a view showing a seventh step of manufacturing the organic electroluminescent device driven by the organic thin-film transistor.
Figure 13:
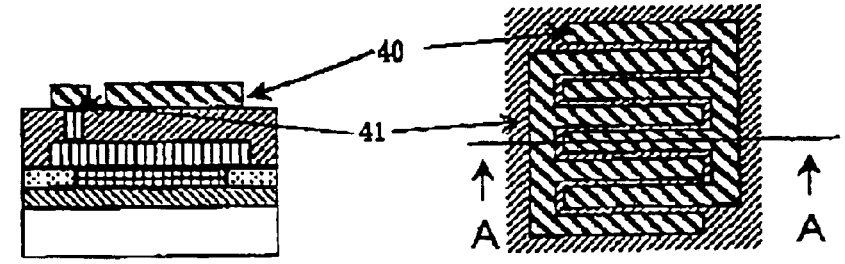
FIG. 13 is a view showing a eighth step of manufacturing the organic electroluminescent device driven by the organic thin-film transistor.

After the via hole 31 is formed, a toluene solution containing a liquid gold based material is applied in the via hole 31 by an I/J method, thereby forming an interlayer wire 32 (FIG. 12). Next, a source 40 and a drain 41 are formed (FIG. 13). In the case described above, as shown in FIG. 13, the source 40 and the drain 41 each have a comb shape and are formed so as to interdigitate with each other with a predetermined spacing therebetween. In addition, the drain 41 is formed so as to be in contact with a cathode layer.

As a material for the source 40 and the drain 41, for example, a metal or a conductive polymeric material may be used. The source 40 and the drain 41 are each formed by selectively forming a film by an I/J method using the material described above followed by patterning. In this embodiment, a toluene solution containing a liquid gold-based material is applied by an I/J method. The thickness of the gold film thus formed is approximately 50 nm.

Figure 14:
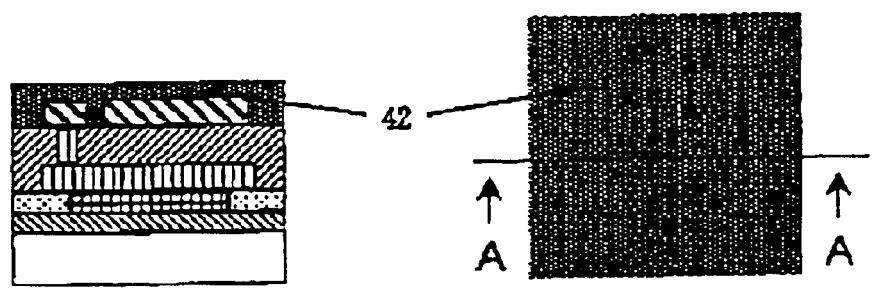
FIG. 14 is a view showing a ninth step of manufacturing the organic electroluminescent device driven by the organic thin-film transistor.

In addition, an organic semiconductor layer 42 is formed on the source 40 and the drain 41 (FIG. 14). This organic semiconductor layer 42 may be formed by spin coating, deposition, an I/J method, or the like using an organic material. In this embodiment, a starting material in the liquid form containing anthracene dissolved in xylene is spin coated, so that an organic semiconductor film composed of anthracene is formed. The thickness thereof is 200 nm. As a material for forming an organic semiconductor film, in addition to a fused polycyclic aromatic group, such as tetracene or pentacene, a conjugated oligomer or polymer, such as hexathienylene, oligothiophene, or polyacethylene, may also be used.

Figure 15:
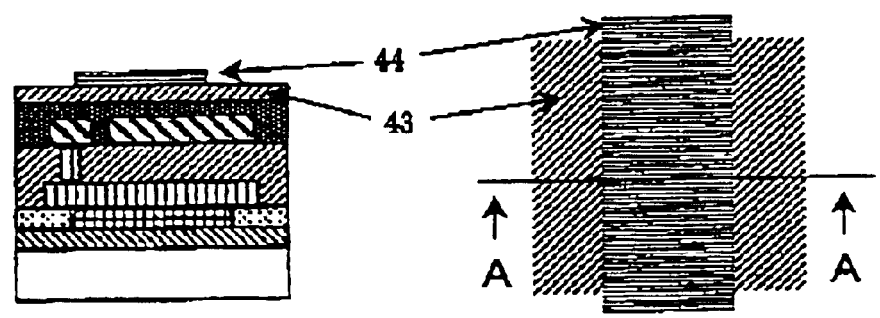
FIG. 15 is a view showing a tenth step of manufacturing the organic electroluminescent device driven by the organic thin-film transistor.
Figure 16:
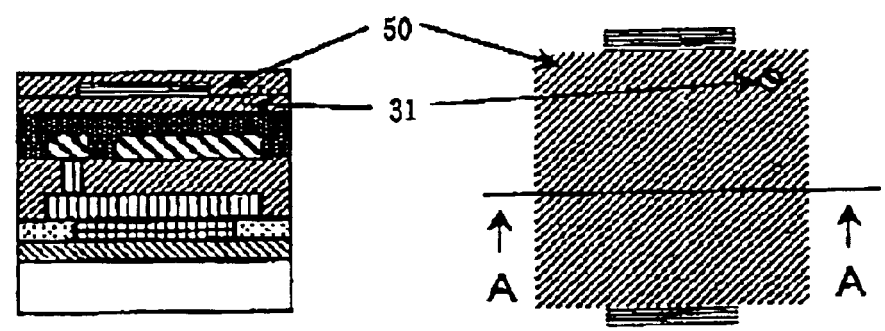
FIG. 16 is a view showing an eleventh step of manufacturing the organic electroluminescent device driven by the organic thin-film transistor.

Next, a gate insulating film 43 is formed on the organic semiconductor layer 42. For this gate insulating film 43, the same material as that for the interlayer insulating film 30 may be used. In this embodiment, by using a PVA film, a thickness of 1 μm is formed by spin coating. In addition, as shown in FIG. 15, a gate line 44 is formed so as to cover corner portions of the source 40 and the drain 41. This gate line 44 is formed by a coating method using a toluene solution containing a liquid gold-based material as in the case of the source 40 and the drain 41. As a solvent for this liquid gold-based material, toluene is used. The thickness of the gold film thus formed is approximately 50 nm.

Next, an interlayer insulating film 50 is formed on the gate insulating film 43 and the gate line 44, and subsequently, a via hole 31 is formed as described above (FIG. 16). However, in this step, after parts of PVA films are dissolved and removed by pure water, a part of the organic semiconductor layer is dissolved and removed by xylene, so that a source line and the source 40 can be electrically connected to each other. A detailed process for forming the via hole is equivalent to that described above with reference to FIGS. 1 to 3. By using an organic silicon compound having an aromatic hydrocarbon group as a starting material for forming a molecular film, a via hole is formed by light irradiation for a short period of time. In this embodiment, (heptadecafluorooctylbenzil)triethoxysilane is used.

Figure 17:
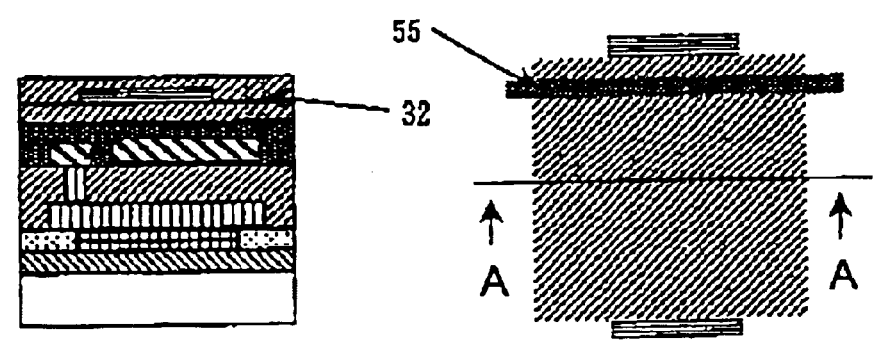
FIG. 17 is a view showing a twelfth step of manufacturing the organic electroluminescent device driven by the organic thin-film transistor.

Finally, a source line 55 is formed on the interlayer insulating film 50 at a position corresponding to the via hole 31 (FIG. 17). The source line 55 is formed together with an interlayer wire 32 so as to be connected to the source 40. A material is formed by an I/J method using a toluene solution containing a liquid gold-based material as described in the case of the source 40 and the drain 41. The thickness of the gold film thus obtained is approximately 50 nm. As described above, the basic process is completed. In this embodiment, a protection film or the like may be formed on the source line 55.

In this embodiment, the formation of an organic electroluminescent element can be performed prior to the formation of an organic thin-film transistor, however, the formation of an organic thin-film transistor may first be formed. In the case described above, a molecular film formed of an organic silicon compound having an aromatic hydrocarbon group may also be used for forming a via hole.

In this embodiment described above, the organic thin-film transistor is formed by using a method for manufacturing a molecular film pattern of the present invention, however, it is apparent that the method for manufacturing the molecular film pattern of the present invention is effectively applied to the production of transistors, which are generally used, that is, is effectively applied to the production of silicon-based transistors or thin-film transistors (TFT) formed on insulating substrates.

In conclusion, conventional steps using a photolithographic method for manufacturing semiconductor devices, electronic devices, electro-optical devices, and the like can be basically performed by using the manufacturing method for the molecular film pattern, the manufacturing method for the semiconductor devices, and the manufacturing method for the electro-optical devices according to the present invention.

Figure 18:
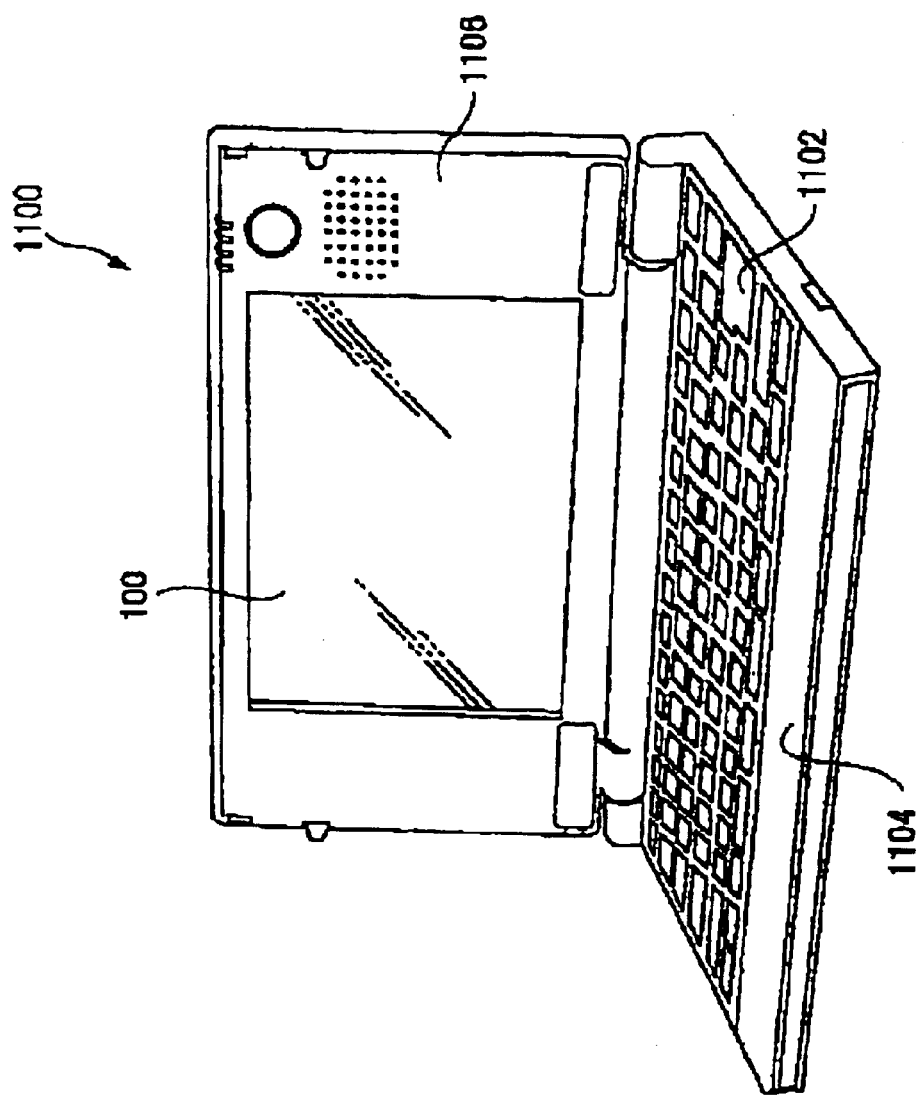
FIG. 18 is a view showing one application example in which an electro-optical device of the present invention is mounted on a mobile type personal computer.

Next, several examples of electronic apparatuses to which the electro-optical device described above is applied will be described. FIG. 18 is a perspective view showing the structure of a mobile personal computer to which the electro-optical device described above is applied. In this figure, a personal computer 1100 has the structure composed of a display unit 1106 and a main body 1104 provided with a keyboard 1102. The display unit 1106 can include the electro-optical device 100 described above.

Figure 19:
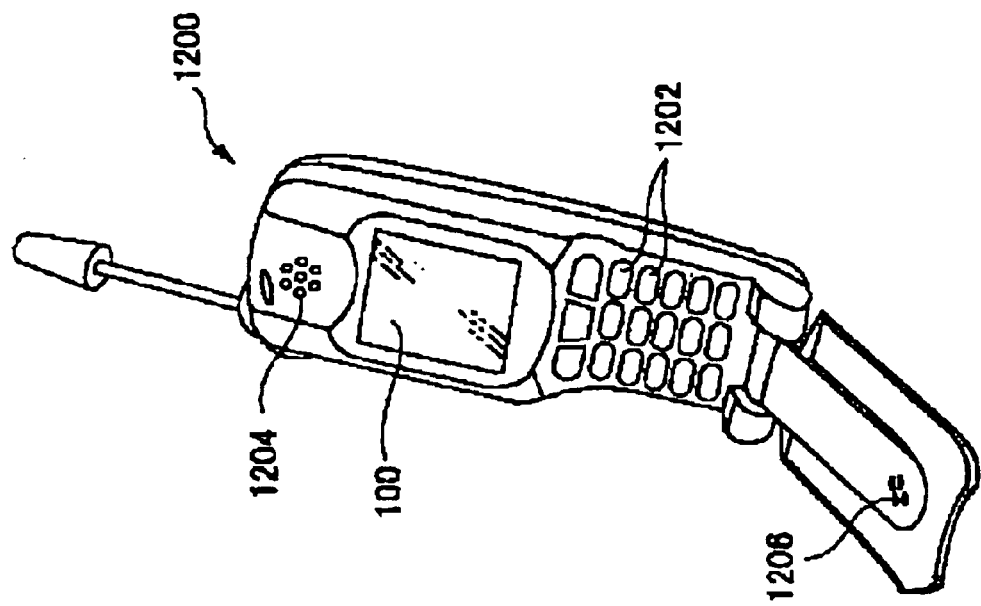
FIG. 19 is a view showing one application example in which an electro-optical device of the present invention is mounted on a mobile phase.

FIG. 19 is a perspective view showing the structure of a mobile phone having the electro-optical device 100 applied to a display unit of this mobile phone. In this figure, in addition to a plurality of operation buttons 1202, an ear piece 1204, and a mouthpiece 1206, a mobile phone 1200 can include the electro-optical device 100 described above.

Figure 7:
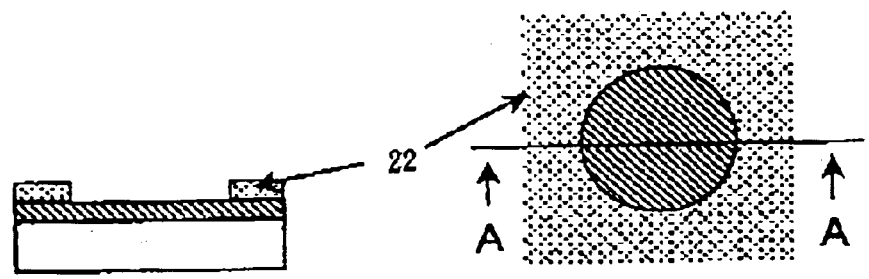
FIG. 7 is a view showing a second step of manufacturing the organic electroluminescent device driven by the organic thin-film transistor.
Figure 8:
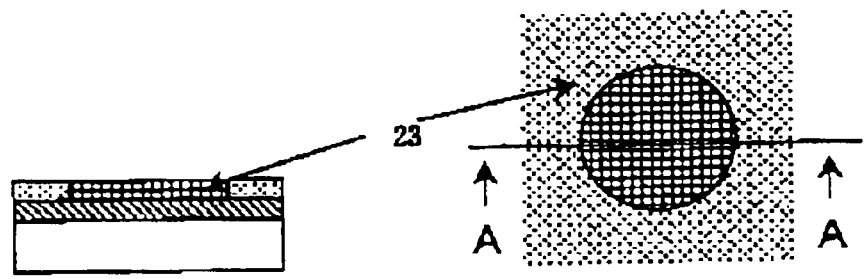
FIG. 8 is a view showing a third step of manufacturing the organic electroluminescent device driven by the organic thin-film transistor.
Figure 9:
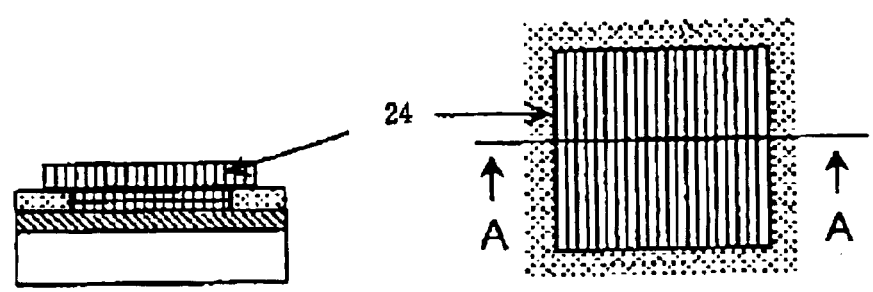
FIG. 9 is a view showing a fourth step of manufacturing the organic electroluminescent device driven by the organic thin-film transistor.
Figure 10:
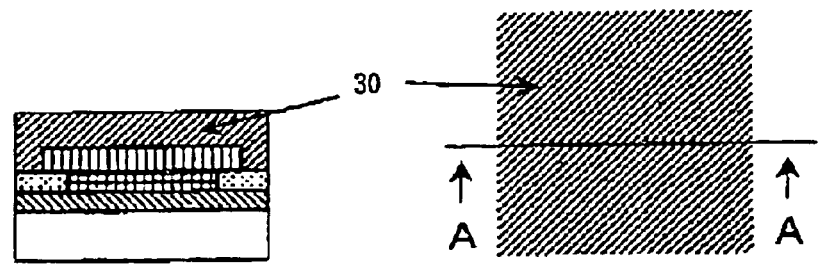
FIG. 10 is a view showing a fifth step of manufacturing the organic electroluminescent device driven by the organic thin-film transistor.
Figure 20:
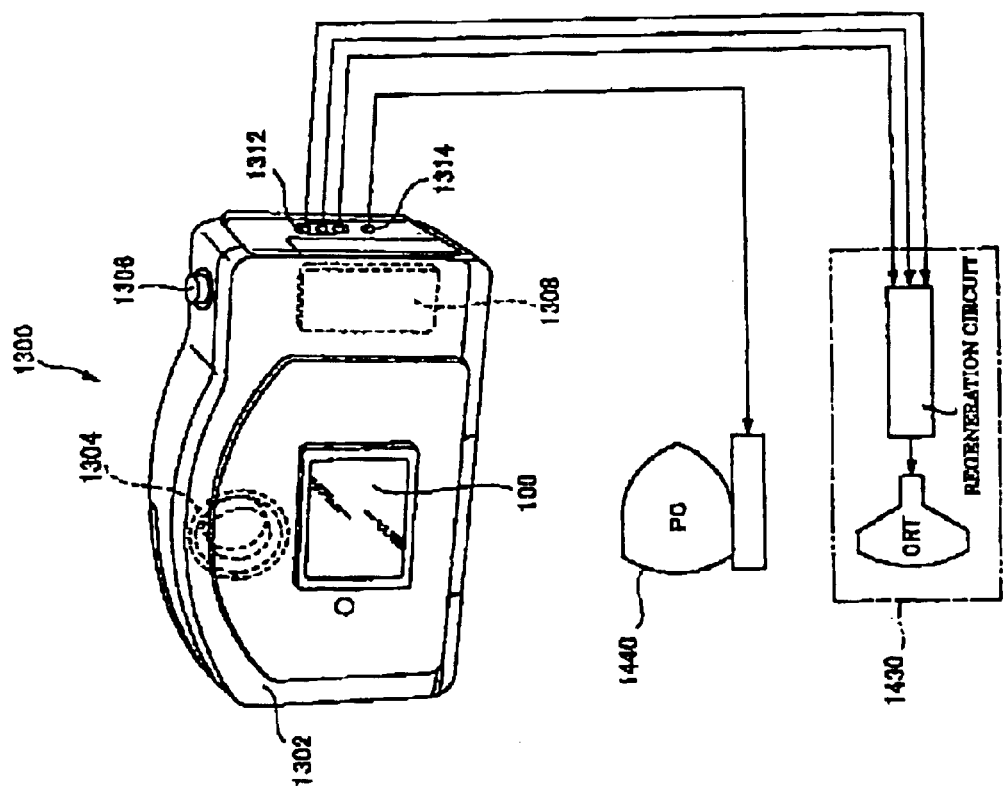
FIG. 20 is a view showing one application example in which an electro-optical device of the present invention is applied to a viewfinder portion of a digital still camera.

FIG. 20 is a perspective view showing the structure of a digital still camera provided with the electro-optical device 100 shown in FIG. 7 which is used for a viewfinder of the camera. In this figure, the connection with external apparatuses is also briefly shown. Compared to a general camera which exposes a film using an optical image of an object, a digital still camera 1300 produces image signals by performing photoelectric conversion of an optical image of an object using an imaging element such as a CCD (Charged Coupled Device). The electro-optical device 100 described above is provided on the back surface of a case 1302 of the digital still camera 1300 so as to perform display in accordance with the image signals provided from the CCD, and the electro-optical device 100 serves as a viewfinder for displaying the object. In addition, a light-receiving unit 1304 containing an optical lens, the CCD, and the like is provided on an observing side (the back surface side in the figure) of the case 1302.

When a picture taker views an object image displayed on the electro-optical device 100 and then presses a shutter button 1306, an image signal of the CCD at that time is transferred to and stored in a memory of a circuit substrate 1308. In addition, in this digital still camera 1300, a video signal output terminal 1312 and an input/output terminal 1314 for data communication are provided on the side surface of the case 1302. As shown in the figure, when it is necessary, the former, i.e., the video signal output terminal 1312, and the latter, i.e., the input/output terminal 1314 for data communication, are connected to a television monitor 1430 and a personal computer 1430, respectively. Furthermore, the structure is formed so that the image signal stored in the memory of the circuit substrate 1308 is output on the television monitor 1430 or to the personal computer 1440 by a predetermined operation.

As an electronic apparatus to which the electro-optical device 100 of the present invention can be applied, in addition to the personal computer shown in FIG. 18, the mobile phone shown in FIG. 19, and the digital still camera shown in FIG. 20, there may be mentioned a television, a viewfinder type and a direct viewing video tape recorder, a car navigation apparatus, a pager, an electronic notebook, an electronic calculator, a word processor, a workstation, a television phone, a POS terminal, an apparatus provided with a touch panel, and the like. Accordingly, the electro-optical device 100 is naturally applied to display units of the various electronic apparatuses described above.

According to the present invention described above, a patterning technique which can easily form a molecular film pattern at a high speed can be obtained, and the number of steps of manufacturing semiconductor devices or electro-optical devices and the cost thereof can be decreased.

What is claimed is:

1. A method for manufacturing a film pattern, comprising:

forming a film by using an organic silicon compound as a starting material; and irradiating at least a part of the film corresponding to the film pattern with a light, the organic silicon compound having a chemical structure represented by

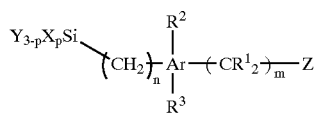

n, m, p, Ar, X, Y, $R^1$, $R^2$ and $R^3$ are as follows:

n is an integer of 0 or more;

m is an integer of 0 or more;

p is an integer that ranges from 0 to 3;

Ar is an aryl group;

$R^1$ is a hydrogen atom or a fluorine atom;

$R^2$ is a hydrogen atom, a halogen atom, a perfluoroalkyl group, a hydroxy group, a thiol group, an amino group, an alkylamino group, an alkoxy group, an alkyl group containing a hydroxy group, an alkyl group containing a thiol group, an alkyl group containing an amino group, an alkyl group containing an alkyl amino group, an organic silicon group, or an alkyl group containing an organic silicon group;

$R^3$ is a hydrogen atom, a halogen atom, a perfluoroalkyl group, a hydroxy group, a thiol group, an amino group, an alkylamino group, an alkoxy group, an alkyl group containing a hydroxy group, an alkyl group containing a thiol group, an alkyl group containing an amino group, an alkyl group containing an alkyl amino group, an organic silicon group, or an alkyl group containing an organic silicon group;

X is a halogen group including a chlorine group, amino group, or an alkoxy group;

Y is an alkyl group, an aryl group, or hydrogen atom; and

Z is an alkyl group, a perfluoroalkyl group, a silyl group, a cyano group, or a thiol group.

2. The method according to claim 1, the organic silicon compound having an affinity atom having affinity to a silicon atom included in the organic silicon compound, and the affinity atom being adjacent spatially to the silicon atom.

3. The method according to claim 2, the affinity atom being a halogen atom including a fluorine atom, a nitrogen atom, or an oxygen atom.

4. The method according to claim 1, the organic silicon compound having at least one of of $R^2$ and $R^3$ at an ortho-position of the aryl group toward a subsituent containing a silyl group of the organic silicon compound.

5. The method according to claim 1,

Ar of the chemical structure being a benzene, a naphthalene, biphenyl, pyridine, anthracene, or phenanthrene.

6. The method according to claim 1, $R^1$, and Z of the chemical structure being a fluorine atom and a perfluoroalkyl group, respectively.

7. The method according to claim 1, the thickness of the film being less than about 3 nm.

8. A method for manufacturing a semiconductor device, comprising:

forming a film pattern by the method according to claim 1 above the base member; and forming a pattern of film including a semiconductor material according to the film pattern.

9. A method for manufacturing an electro-optical device, comprising:

forming a film pattern by the method according to claim 1 above the base member; and forming a pattern of film including an electro-optical material according to the film pattern.

10. A method for manufacturing an electronic device comprising:

forming a film pattern by the method according to claim 1 above the base member; and forming a pattern of film including a functional material according to the film pattern.

11. A method for manufacturing a film pattern, comprising:

forming a film by using an organic silicon compound that contains an aryl group as starting material; and irradiating at least a part of the film corresponding to the film pattern with a light, the organic silicon compound having a first substituent and a second substituent on the aryl group, the first substituent containing a silicon atom, and the second substituent being disposed at an ortho-position of the aryl group toward the first substituent.

12. The method according to claim 11, the second substituent containing an affinity atom having affinity to the silicon atom.

13. The method according to claim 12, the affinity atom being a halogen atom including a fluorine atom, a nitrogen atom, or an oxygen atom.

14. The method according to claim 12, the organic silicon compound having a bond between the silicon atom and an atom, and the affinity atom assisting breakage of the bond.

15. The method according to claim 12, the affinity atom reducing energy of breakage of the bond.

16. The method according to claim 12, the affinity atom being adjacent spatially to the silicon atom.

17. The method according to claim 11, the aryl group being a phenyl group, a biphenyl, a pyridyl group, a naphthyl group, an anthryl group, or a phenanthryl.

18. A method for manufacturing a film pattern, comprising:

forming a film by using an organic silicon compound that contains an aryl group as starting material; and irradiating at least a part of the film corresponding to the film pattern with a light, the organic silicon compound having a first substituent and a second substituent on the aryl group, the first substituent containing a silicon atom, the second substituent containing an affinity atom having affinity to the silicon atom, and the affinity atom being adjacent spatially to the silicon atom.

19. The method according to claim 18, the affinity atom assisting breakage of a bond between the silicon atom and an atom.

20. The method according to claim 18, the affinity atom reducing energy of breakage of the bond.

* * * * *